(12) United States Patent
Wang et al.

(10) Patent No.: US 8,373,061 B2
(45) Date of Patent: Feb. 12, 2013

(54) PHOTOVOLTAIC CELLS WITH STACKED LIGHT-ABSORPTION LAYERS AND METHODS OF FABRICATING THE SAME

(75) Inventors: Shih-Yuan Wang, Palo Alto, CA (US);
Sagi Mathai, Palo Alto, CA (US);
Michael Tan, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1005 days.

(21) Appl. No.: 12/259,969

(22) Filed: Oct. 28, 2008

(65) Prior Publication Data

US 2010/0024869 A1 Feb. 4, 2010

Related U.S. Application Data

(60) Provisional application No. 61/126,045, filed on Apr. 29, 2008.

(51) Int. Cl.
*H01L 31/00* (2006.01)

(52) U.S. Cl. .................................................. 136/255

(58) Field of Classification Search .................. 136/250
See application file for complete search history.

(56) References Cited

U.S. PATENT DOCUMENTS

| 5,871,888 | A  | * | 2/1999  | Heremans et al. ............ 430/321 |
| 2002/0026955 | A1 | * | 3/2002  | Ouchida et al. ............... 136/251 |
| 2005/0150542 | A1 | * | 7/2005  | Madan ........................... 136/255 |
| 2006/0207647 | A1 | * | 9/2006  | Tsakalakos et al. .......... 136/256 |
| 2007/0272297 | A1 | * | 11/2007 | Krivoshlykov et al. ....... 136/256 |
| 2008/0006319 | A1 | * | 1/2008  | Bettge et al. .................. 136/244 |

* cited by examiner

*Primary Examiner* — Miriam Berdichevsky (57) ABSTRACT

Embodiments of the present invention are directed to photovoltaic cells configured with two or more nanowire-based, light-absorption layers, each layer capable of absorbing a different portion of the electromagnetic spectrum. In one embodiment, a photovoltaic cell comprises a substrate configured with a first planar surface, a second planar surface opposite the first planar surface, and an opening. The photovoltaic cell includes a first photovoltaic cell disposed on the first planar surface and having a first set of nanowires extending over the opening. The photovoltaic cell includes a second photovoltaic cell disposed on the second planar surface and having a second set of nanowires extending over the opening opposite the first set of nanowires.

10 Claims, 11 Drawing Sheets

PHOTOVOLTAIC CELLS WITH STACKED LIGHT-ABSORPTION LAYERS AND METHODS OF FABRICATING THE SAME

CROSS-REFERENCE TO RELATED APPLICATION

The present application claims priority from provisional application Ser. No. 61/126,045, filed Apr. 29, 2008, the contents of which are incorporated herein by reference in their entirety.

TECHNICAL FIELD

Embodiments of the present invention relate to photovoltaic ceils, and, in particular, to photovoltaic cells configured with a stack of two or more light-absorption layers.

BACKGROUND

Photovoltaic cells are devices that convert light energy into electricity via a light-absorbing material. The electricity can flow through wires to power electronic devices. A solar cell is a type of photovoltaic cell configured to capture and convert sunlight into electricity. Assemblies of solar cells can be arrayed into modules, which, in turn, can be linked together into solar arrays. These arrays can be used to generate electricity in places where a power grid is not available, such as in remote area power systems. Earth-orbiting satellites and space probes, remote radio telephone, and water pumping systems. In recent years, due to the increasing costs of generating electricity from fossil fuels, the demand for solar arrays to supplement home and commercial electrical power needs has increased.

However, most conventional photovoltaic cells only convert a small portion of the electromagnetic spectrum into electricity. For example, efficiencies vary from about 6 to about 10% for amorphous silicon-based photovoltaic cells to about 43% for multiple junction-based photovoltaic cells. In addition, mass producing the more efficient multiple junction photovoltaic cells to form photovoltaic arrays may be cost prohibitive. For example, the cost of mass producing a multiple junction photovoltaic cell may be as much as 100 times greater than the cost of producing the less efficient amorphous silicon-based cell. Most conventional photovoltaic cells are single-junction silicon cells that absorb a relatively narrow range of photon energies. As a result, much of the light that is incident on photovoltaic ceil is not absorbed. Thus, engineers and physicists have recognized a need for high-efficiency photovoltaic cells that can extract a larger portion of the electromagnetic spectrum.

SUMMARY

Embodiments of the present invention are directed to photovoltaic cells configured with a stack of two or more nanowire-based, light-absorption layers, each light-absorption layer capable of absorbing a different portion of the electromagnetic spectrum. In one embodiment, a photovoltaic cell comprises a substrate configured with a first planar surface, a second planar surface opposite the first planar surface, and an opening. The photovoltaic cell includes a first photovoltaic cell disposed on the first planar surface and having a first set of nanowires extending over the opening. The photovoltaic cell includes a second photovoltaic cell disposed on the second planar surface and having a second set of nanowires extending over the opening opposite the first set of nanowires,

DETAILED DESCRIPTION

Embodiments of the present invention are directed to photovoltaic cells configured with a stack of two or more nanowire-based, light-absorption layers, each light-absorption layer capable of absorbing a different portion of the electromagnetic spectrum. As a result, photovoltaic ceils of the present invention can convert a larger overall portion of the electromagnetic spectrum into electrical power than conventional photovoltaic cells configured with only a single light-absorption layer.

I. General Operation of Light-Absorption Layers of Photovoltaic Cells

Figure 1A:
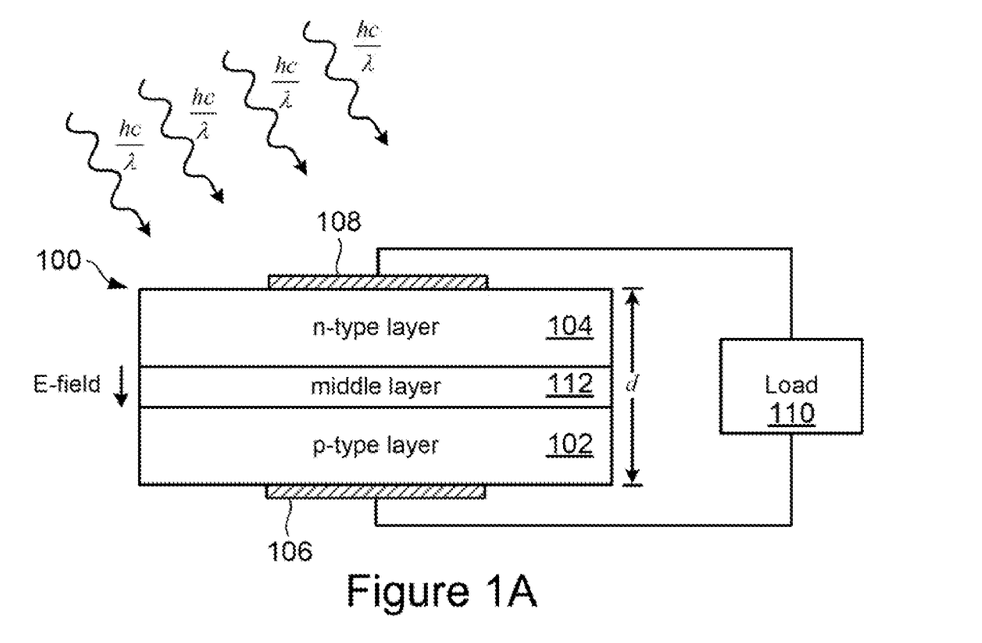
FIG. 1A shows a side elevation view of a photovoltaic cell.

FIG. 1A shows a schematic representation of a photovoltaic cell 100. The cell 100 comprises a p-type semiconductor layer 102 and an n-type semiconductor layer 104, A first electrode 106 is disposed on the p-type layer 102, and a second electrode 108 is disposed on the n-type layer 104. The electrodes 106 and 108 are connected to a load .110, such as an electronically operated device. The p-type layer 102 is doped with an electron accepting impurity having fewer electrons than the surrounding atoms in the semiconductor lattice creating vacant electronic energy states that can be characterizes as positively charged holes. In contrast, the n-type layer 104 is doped with electron donating impurities that donate electrons to the semiconductor lattice. The electrons and holes are called "charge carriers." A middle layer 112 sandwiched between the p-type layer 102 and the n-type layer 104 can be composed of a separate intrinsic semiconductor material or it can be formed between the p-type layer 102 and the n-type layer 104 as a result of electrons diffusing from the n-type layer 104 into the p-type layer 102 and holes diffusing from the p-type layer 102 into the n-type layer 104. A potential difference develops across layer 112 which induces an electric field directed from the interface between the layer 112 and the n-type layer 104 to the interface between the layer 112 and the p-type layer 102. This electric field forces electrons and holes in the layer 112 to drift into the n-type layer 104 and p-type layer 102, respectively. Ultimately, equilibrium is reached when the number of charge carriers diffusing across the layer 112 equals the number of charge carriers drifting across the layer 112.

Figure 1B:
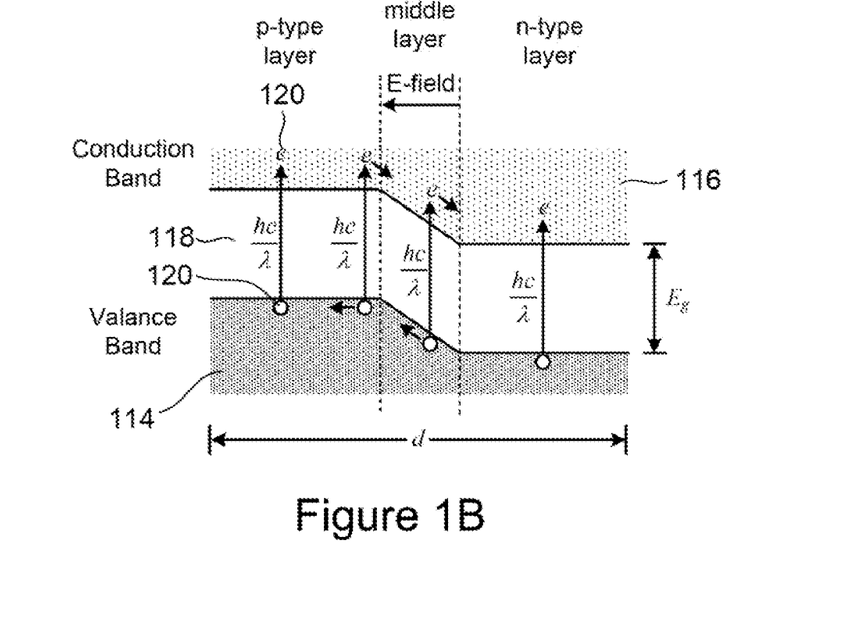
FIG. 1B shows an electronic energy-band diagram for the semiconductor layers of the photovoltaic cell shown in FIG. 1A.

FIG. 1B shows an electronic energy-band diagram associated the light-absorption layers 102, 104, and 112. Heavily shaded layers, such as layer 114., represent a continuum of mostly filled electronic energy states in the valence band, lightly shaded layers, such as layer 116, represent a continuum of mostly empty electronic energy states in the conduction band, and layers, such as layer 118, represent the electronic band gap where no electronic energy states exists. Electron donating impurities create electronic states near the conduction band while electron accepting impurities create electronic states near the valence band. Thus, the valence and conduction bands associated with the p-type layer 102 are higher in electronic energy than the valence and conduction bands associated with n-type layer 104.

The photovoltaic cell 100 is positioned so that photons of incident light, shown in FIG. 1A, can penetrate the layers 102, 104, and absorb in layer 112. As shown in FIG. 1B, when photons of the incident light have photon energies satisfying:

$$\frac{hc}{\lambda} \geq E_g$$

where h is Plank's constant and $\lambda$ is the wavelength of the photon, the photons are absorbed and electrons, denoted by "e" are excited from the valence band into the conduction band creating electron-hole pairs, such as electron-hole pair 120. The force of the electric field across the layer 112 sweeps electrons in the conduction bands of the layers 102, 104, and 112 into the top electrode 108 and to power the load 110. The electrons then pass through the load 110 and the bottom electrode 106 until the electrons reach the p-type layer 102 where they recombine with holes.

The electronic bandgap energy shown in FIG. 1B is the same for all three layers 102, 104, and 112. This may be the result of all three layers being composed of the same semiconductor material. In other words, the layers 102, 104, and 112 form a homojunction solar cell. Silicon-based solar cells are one example of homojunction solar cells. In contrast, the most efficient solar cells are typically heterojunction solar cells. In a heterojunction solar cell, the p-type and n-type layers 102 and 104 are composed of semiconductor materials that have larger electronic bandgap energies than the middle layer 112. For example, the p-type and n-type layers 302 and. 104 of a heterojunction solar cell can be composed of AlGaAs and the middle layer 112 can be composed GaAs, Ideally, the layer 112 forms the light-absorption layer of the photovoltaic cell 100, where layers 102 and 104 are transparent to the incidnet light. The most efficient photovoltaic cells have the electron-hole pairs generated by photons in the layer 112, which has the highest electric field tor sweeping out the charge carriers to create the external electric current. Electron-hole pairs generated in the layers 102 and 104 need to diffuse into the high electric field region of the layer 112 to generate an external current. Occasionally, electron-hole pairs can recombine at defects and surface states before the pairs can be seperated resulting in a decrease in efficiency of the photovoltaic cell 100.

Figure 2A:
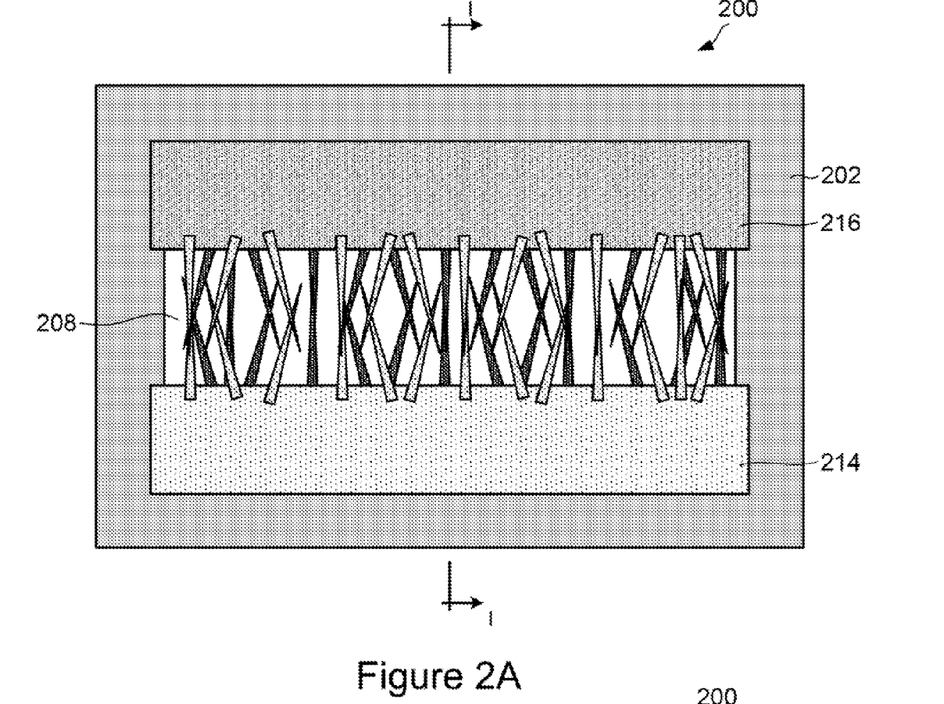
FIG. 2A shows a top view of a first photovoltaic cell with a stack of laterally configured light-absorption layers configured in accordance with embodiments of the present invention.
Figure 2B:
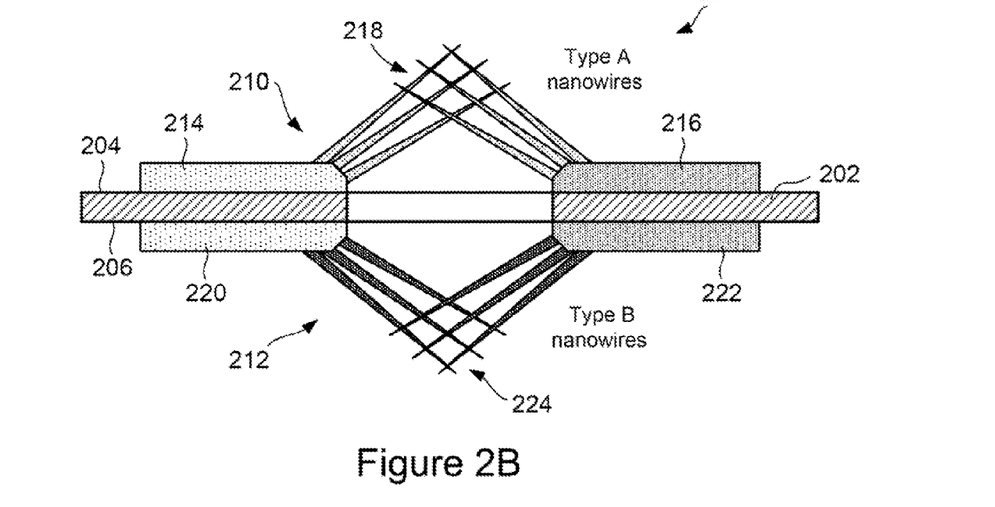
FIG. 2B shows a cross-sectional view of the first photovoltaic cell, along a line I-I shown in FIG. 2A, in accordance with embodiments of the present invention.

II. Photovoltaic Cell with a Stack of Laterally Arranged Light-absorption Layers FIG. 2A shows a top view of a first photovoltaic device 200 composed of two photovoltaic cells configured in accordance with embodiments of the present invention. FIG. 2B shows a cross-sectional view of the photovoltaic device 200, along a line I-I shown in FIG. 2A, in accordance with embodiments of the present invention. The photovoltaic device 200 includes a substantially flat substrate 202 configured with a first planar surface 204, a second planar surface 206 opposing the first planar surface 204, and a rectangular-shaped opening 208. The photovoltaic device 200 includes a first photovoltaic cell 210 disposed on the first planar surface 204 and a second photovoltaic cell 212 disposed on the second planar surface 206. The first photovoltaic cell 210 is composed of a first p-type semiconductor layer 214 located on one side of the opening 208 and a first n-type semiconductor layer 216 located on opposite side of the opening 208. As shown in FIG. 2, the first photovoltaic cell 210 also includes a set of semiconductor nanowires 218 extending outward from angled portions of the first p-type layer 214 and the first n-type layer 216 and intersecting over the opening 208. The second photovoltaic cell 212 is composed of a second p-type semiconductor layer 220 and a second n-type semiconductor layer 222 located on opposite sides of the opening 208. As shown in FIG. 2, the second photovoltaic cell 212 also includes a set of semiconductor nanowires 224 extending outward from angled portions of the p-type layer 220 and the n-type layer 222 and intersecting over the opening 208.

Figure 3:
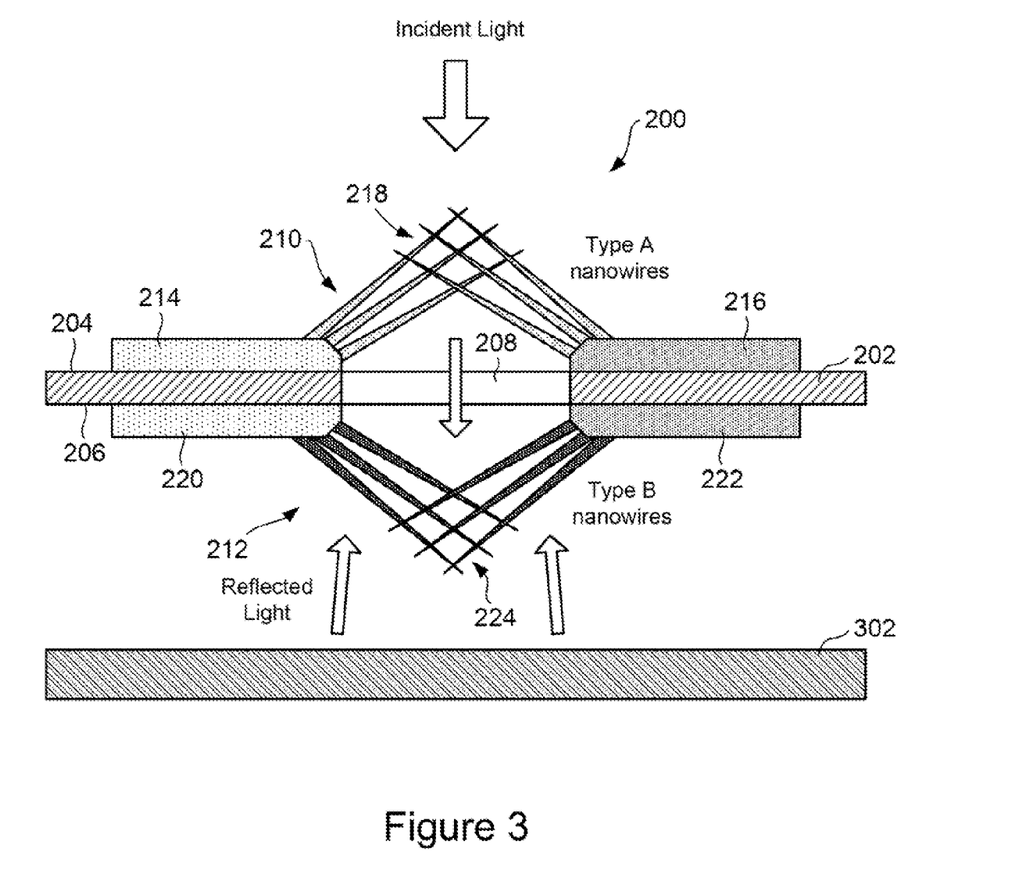
FIG. 3 shows the first photovoltaic cell shown in FIG. 2 positioned above a reflective surface in accordance with embodiments of the present invention.

In certain embodiments, the photovoltaic device 200 can be positioned above a reflective surface. FIG. 3 shows the photovoltaic device 200 positioned above a reflective surface 302 in accordance with embodiments of the present invention. As shown in FIG. 3, incident light first strikes the first photovoltaic cell 210. A portion of the incident light that is not absorbed by the first set of nanowires 218 passes through the opening 208 to the second set of nanowires 224. Light that is not absorbed by the second set of nanowires 224 is reflected off of the reflective surface 302 and has a second chance at being absorbed by either the first or second set of nanowires 218 and 224. Note that in other embodiments, the reflective surface 302 can be concave in order to concentrate reflected light onto the first and second sets of nanowires 218 and 224.

The semiconductor layers 214, 216, 220, and 222 and the first and second sets of nanowires 218 and 224 can be composed of various combinations of elemental or compound semiconductors depending on how the photovoltaic device 200 is employed and on manufacturing costs. For example, a low cost photovoltaic device 200 can be fabricated using amorphous, non-single crystalline or crystalline silicon ("Si"), germanium (Ge), silicon carbide (SiC), or other non-single crystal semiconductors, for the layers 214, 216, 220, and 222. Elemental semiconductors include Si and germanium ("Ge"), and compound semiconductors are typically III-V materials, where Roman numerals III and V represent elements in the IIIa and Va columns of the Periodic Table of the Elements. Compound semiconductors can be composed of column IIIa elements, such as Aluminum ("Al"), Gallium ("Ga"), and Indium ("In"), in combination with column Va elements, such as Nitrogen ("N"), Phosphorus ("P"), Arsenic ("As"), and Antimony ("Sb"). Compound semiconductors can be classified according to the relative quantities of III and V elements. For example, binary compound, semiconductors include GaAs, InP, GaN, InN, InAs, and GaP; ternary compound semiconductors include InGaN, AlGaN, $GaAs_yP_{1-y}$, where y ranges between 0 and 1; and quaternary compound semiconductors include $In_xGa_{1-x}As_yP_{1-y}$, where both x and y independently range between 0 and 1. Other types of suitable compound semiconductors include II-VI materials, where II and VI represent elements in the IIb and VIa columns of the periodic table, CdSe, ZnSe, ZnS, and ZnO are examples of binary II-VI compound semiconductors.

The p-type layers 214 and 220 are created by doping the layers 214 and 220 with appropriate electron acceptor impurities, and the n-type layers 216 and 222 are created by doping the layers 216 and 222 with appropriate electron donor impurities. The electron donor and acceptor impurities can be atoms. For example, boron ("B") is a suitable electron acceptor impurities for the layers 214 and 220 composed of a column IV material, such as Si. Arsenic ("As") is a suitable electron donor impurity for the layers 216 and 222 composed of a column IV material, such as Si.

The substrate 202 can be composed of glass, $SiO_2$, $Si_3N_4$, $Al_2O_3$, or another suitable rigid dielectric material, or the substrate 202 can be composed of acrylic or another suitable flexible dielectric material. Or it can be dielectric coated stainless steel or or a suitable metal foil The nanowires 218 and 224 can be composed of an intrinsic semiconductor or a partially intrinsic semiconductor. In FIGS. 2 and 3, the first set of nanowires 218 are distinguished from the second set of nanowires 224 by different shading and are also identified as type A. and type B nanowires, respectively. The type A nanowires are composed of a semiconductor material with a relatively larger electronic bandgap energy than the type B nanowires. A general description of employing the type A and type B nanowires to convert, different portions of the electromagnetic spectrum into electrical power is provided below in subsection IV.

In certain embodiments, the layers and nanowires of the photovoltaic cells 210 and 212 can all be composed of the same semiconductor material to form homojunction photovoltaic cells 210 and 212. In other embodiments, the layers 214, 216, 220, and 222 can be composed of semiconductor materials with relatively larger electronic bandgap energies than the semiconductor material used for nanowires 218 and 224 to form heterojunction photovoltaic cells 210 and 212.

Figure 4A:
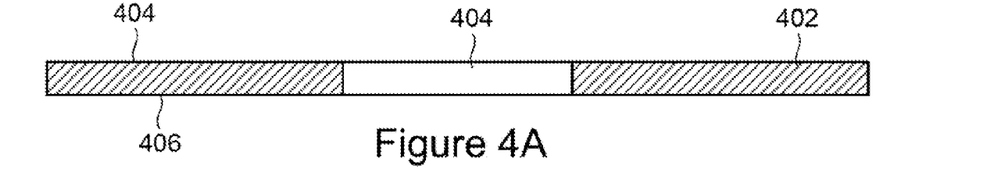
FIGS. 4A-4G show cross-sectional views of various stages of fabricating the first photovoltaic cell shown in FIG. 2 in accordance with embodiments of the present invention.
Figure 4B:
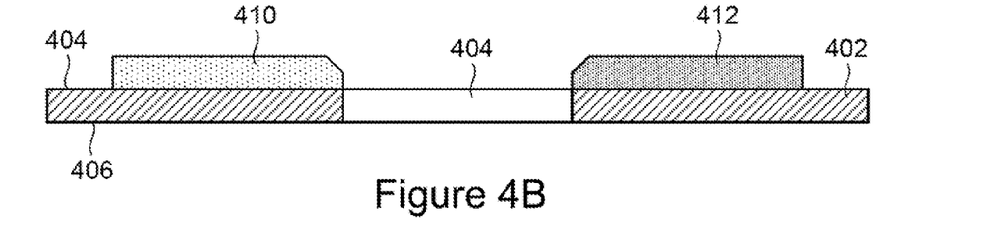
Figure 4C:
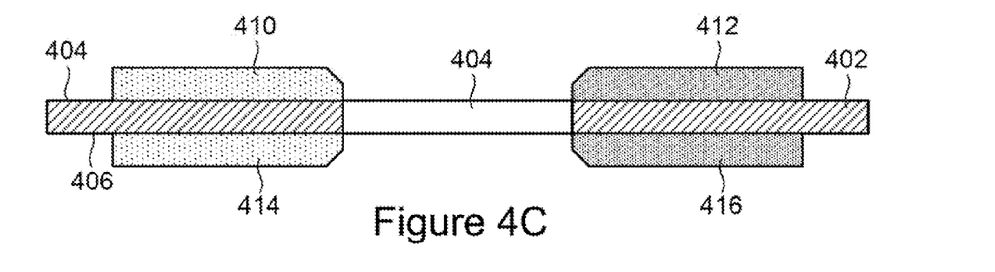
Figure 4D:
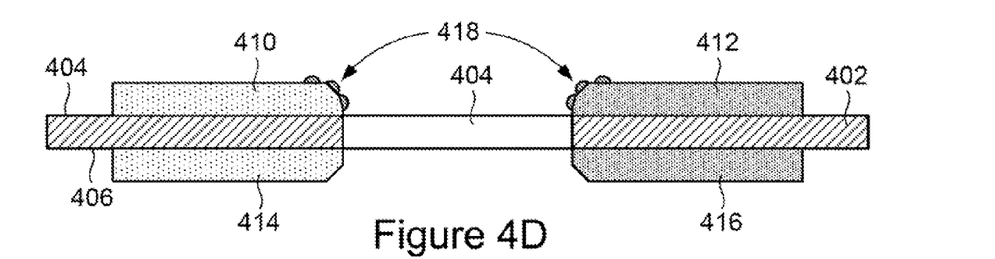
Figure 4E:
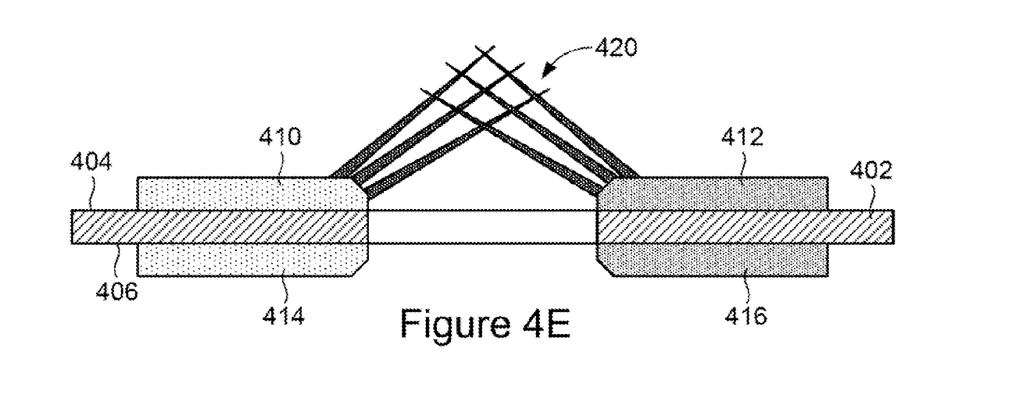
Figure 4F:
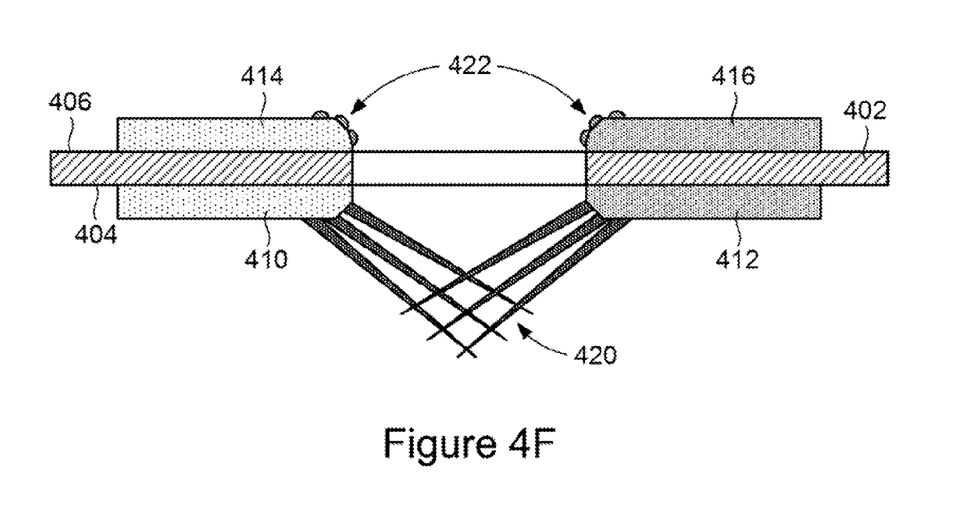
Figure 4G:
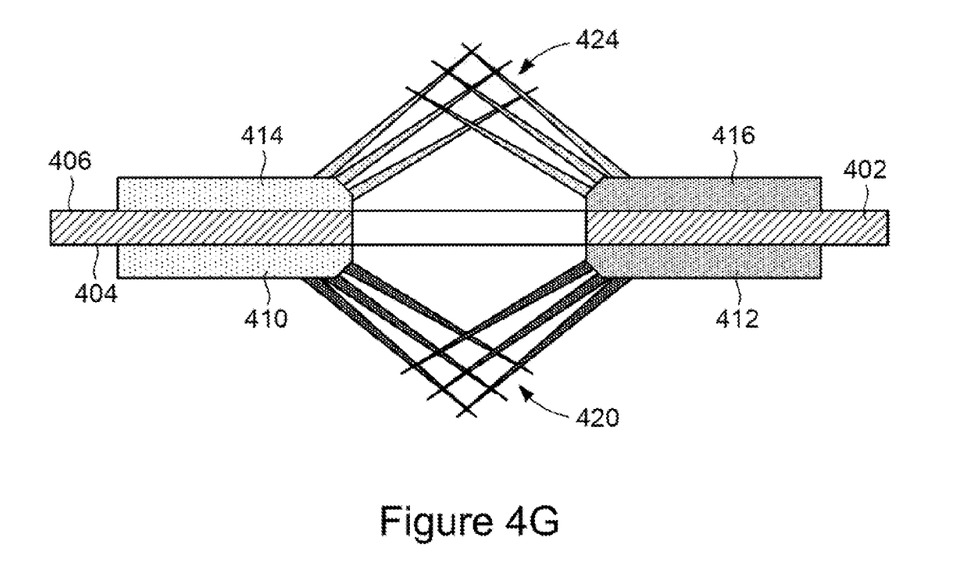

FIGS. 4A-4G show cross-sectional views of various stages in fabricating the photovoltaic device 200, shown in FIG. 2, in accordance with embodiments of the present invention. Initially, as shown in FIG. 4A, a substrate 402 having a first planar surface 404, a second planar surface 406 opposing the first planar surface 404, and a rectangular-shaped opening 408 is provided. Next, as shown in FIG. 4B, a first semiconductor layer 410 and a second semiconductor layer 412 are deposited on the first surface 404 using physical vapor deposition ("FVD"), plasma-enhanced chemical vapor deposition ("PECVD"), or wafer bonding. The semiconductor layers 410 and 412 can be amorphous silicon, crystalline silicon, or a compound semiconductor. The layers 410 and 412 can be deposited separately. In certain fabrication embodiments, while the semiconductor composing the layer 410 or the layer 412 is forming, an appropriate electron donor or electronic acceptor impurity is introduced to the reaction chamber. Alternatively, the layers 410 and 412 can be formed by first depositing an intrinsic semiconductor followed by separately doping the layers 410 and 412 using dopant diffusion or implantation followed by annealing. In a separate processing step, the edges of the semiconductor layers 410 and 412 near the opening 404 can be angled using reactive ion etching ("RIE"), focused ion beam milling ("FIB"), or planarization using chemical mechanical polishing ("CMP"). Next, as shown in FIG. 4C, the steps associated with FIG. 4B can be repeated to give a p-type semiconductor layer 414 and an n-type semiconductor layer 416. Next, as shown in FIG. 4D, seed particles 418 are deposited on and near the angled surfaces of the layers 410 and 412 using a spray coating process or the layers 410 and 412 can be dipped into a seed particle colloidal, solution. The seed particles can be gold ("An"), titanium ("Ti"), Mi, chromium ("Cr"), platinum ("Pt"), palladium ("Pd"), aluminum ("Al"), or another suitable metal conductor or metal alloy that can be used as a catalyst. Next, as shown in FIG. 4E, using chemical, vapor deposition ("CVD"), nanowires 420 are grown in accordance with well-known vapor-liquid-solid ("VLS") growth mechanism or vapor-solid-solid ("VSS") growth mechanism. Continued supply of the vapor-phase reactants results in supersaturation of the catalyst 418, which eventually causes precipitation of excess liquid-phase material forming the nanowires beneath the seed particles. Next, as shown in FIG. 4F, the substrate can be inverted and seed particles 422 are deposited, on the angled surfaces of the layers 414 and 416 using the spray coating or the layers 414 and 416 can be dipped into a seed particle colloidal solution. Next, as shown in FIG. 4G, CVD can be used to grow nanowires 424 in accordance with VLS or VSS to yield the photovoltaic device 200.

III. Photovoltaic Cell with Stacked Light-absorption Layers

Figure 5A:
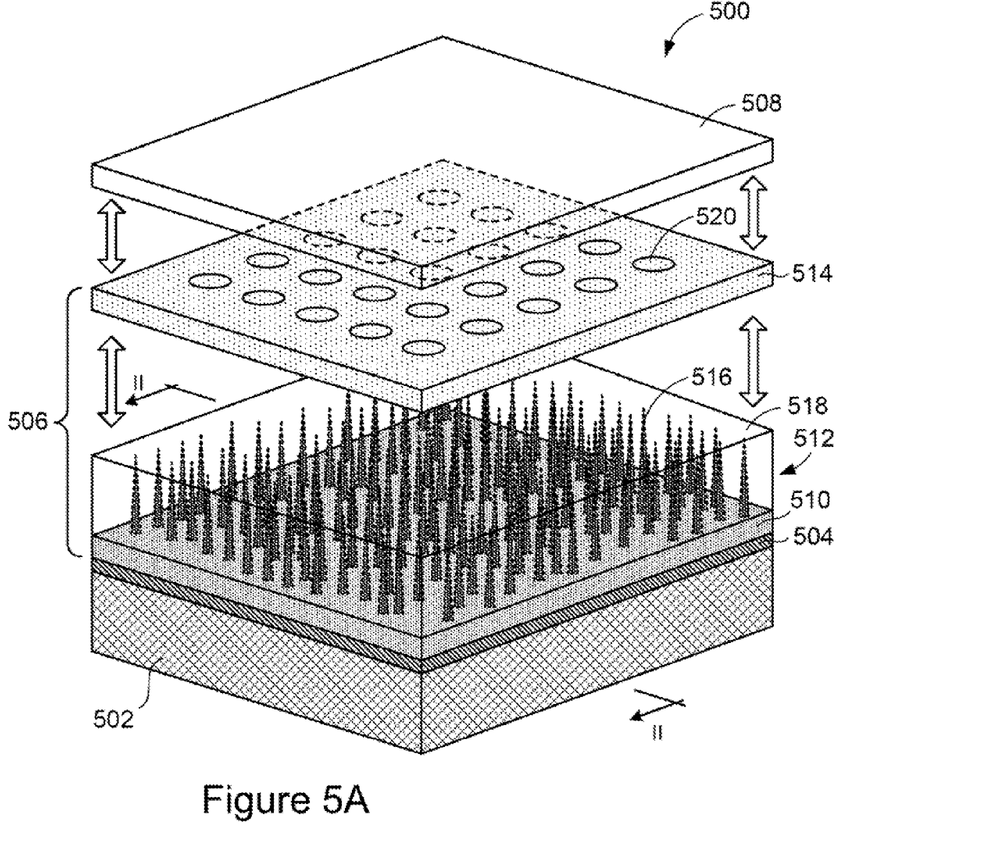
FIG. 5A shows an exploded isometric view of a second photovoltaic cell with vertically arranged light-absorption layers configured in accordance with embodiments of the present invention.
Figure 5B:
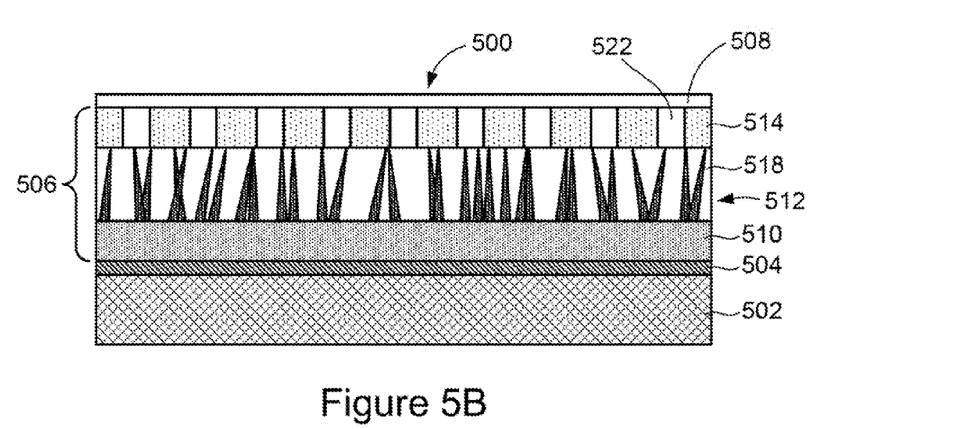
FIG. 5B shows a cross-sectional view of the second photovoltaic cell, along a line II-II shown in FIG. 5A, configured in accordance with embodiments of the present invention.

FIG. 5A shows an exploded isometric view of a photovoltaic cell 500 with vertically arranged light-absorption layers configured in accordance with embodiments of the present invention. FIG. 5B shows a cross-sectional view of the photovoltaic cell 500. along a line II-II shown in FIG. 5A, configured in accordance with embodiments of the present invention. The photovoltaic cell 500 includes a substrate 502, a bottom electrode 504, a light-absorption layer 506 disposed on the bottom electrode 504, and a top electrode 508 disposed on the light absorption layer 506. The light-absorption layer 506 is composed of an n-type semiconductor layer 510 disposed on the bottom electrode 504, a nanowire layer 512 disposed on the n-type layer 510, and a p-type semiconductor layer 514 disposed on the nanowire layer 512.

Note that in certain embodiments, the n-type layer 510 and the p-type 514 can absorb incident light, but these layers are typically not as efficient at absorbing light as the nanowire layer 512. In other more efficient photovoltaic cell 500 embodiments, the n-type layer 510 and the p-type 514 are substantially transparent to incident light and any electron-hole pairs generated in these layers diffuse into the nanowire layer 512 where they are swept out by electric field across the nanowire layer 512.

The n-type layer 510 and the p-type layer 514 can be composed of the same elemental and compound semiconductor materials, single crystal or non-single crystal, and electron donor and acceptor impurities as the n-type layers 216 and 222 and the p-type layers 214 and 220 described above for the photovoltaic cell 200, As shown in FIG. 5A, the p-type layer 514 includes holes, such as hole 520, and, as shown in FIG. 5B, the holes, such as hole 522, span the height of the layer 514. The holes are included to facilitate incident light reaching the nanowires. The nanowires, such as nanowire 516, in the nanowire layer 512 can be composed of an intrinsic semiconductor material embedded in glass, acrylic, or another suitable transparent dielectric material 518. As shown in FIG. 5, the nanowires extend with a substantially perpendicular projection from the top surface of the n-type layer 510, and a number of the nanowires contact the p-type layer 514. in certain embodiments, depending on the composition and surface configuration of the layer 510 the nanowires can be projected substantially perpendicular to the top surface of the layer 510 or randomly oriented. For example, a single crystalline layer 510 produces substantially perpendicular oriented nanowires, while a non-crystalline layer 510 produces randomly oriented nanowires.

In certain embodiments, the layers 510 and 512 and the nanowires in the nanowire layer 512 can all be composed of the same semiconductor material to form a homojunction photovoltaic cell 500. In other embodiments, the layers 510 and 512 can be composed of semiconductor materials with relatively larger electronic bandgap energies than the semiconductor materials used for the nanowires in the nanowire layer 512 to form a heterojunction photovoltaic cell 500.

The bottom electrode 504 can be composed of stainless steel, Al, Cu, or another suitable metal conductor, and the top electrode 508 can be composed of transparent conducting oxide ("TCO"), such as tin-doped indium oxide ("ITO"), or another suitable transparent conductor. In other embodiments, the top electrode 508 can be composed of a. stainless steel, Al, Co or an suitable metal conductor that covers only a portion of the p-type layer 514 or includes an array of holes that allows light to penetrate the layers 510, 512, and 514. The substrate 502 can be composed of glass, $SiO_2$, $Si_3N_4$, $Al_2O_3$, or another suitable rigid dielectric material, or the substrate 502 can be composed of acrylic or another suitable flexible dielectric material. The photovoltaic cell 500 is a p-i-n junction diode that can be operating to convert incident light into electrical power as described above with reference to FIG. 1. In other embodiments, the composition of the p-type layer 514 and the n-type layer 510 can be reversed such that the layer 514 is an n-type semiconductor and the layer 510 is a p-type semiconductor.

Figure 6A:
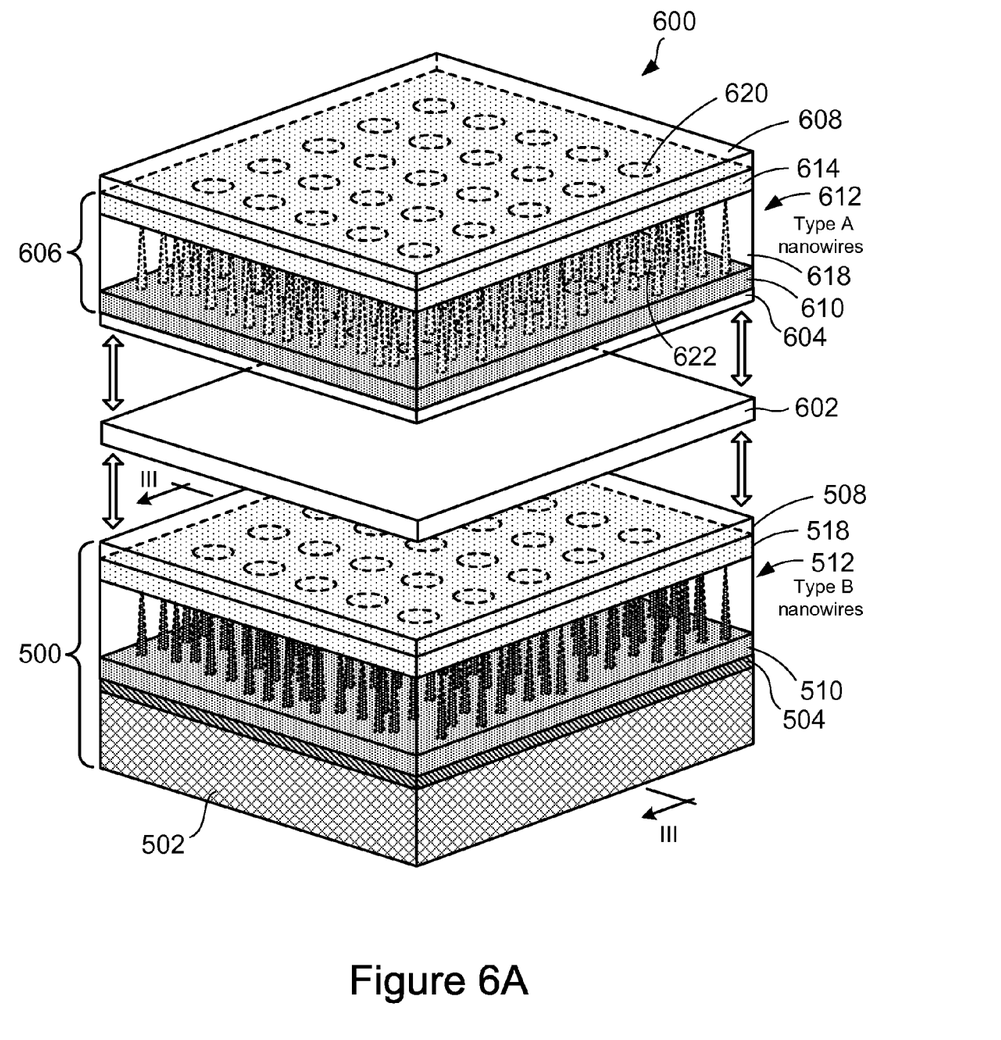
FIG. 6A shows an exploded isometric view of a third photovoltaic ceil with a stack of two vertically arranged light-absorption layers configured in accordance with embodiments of the present invention.
Figure 6B:
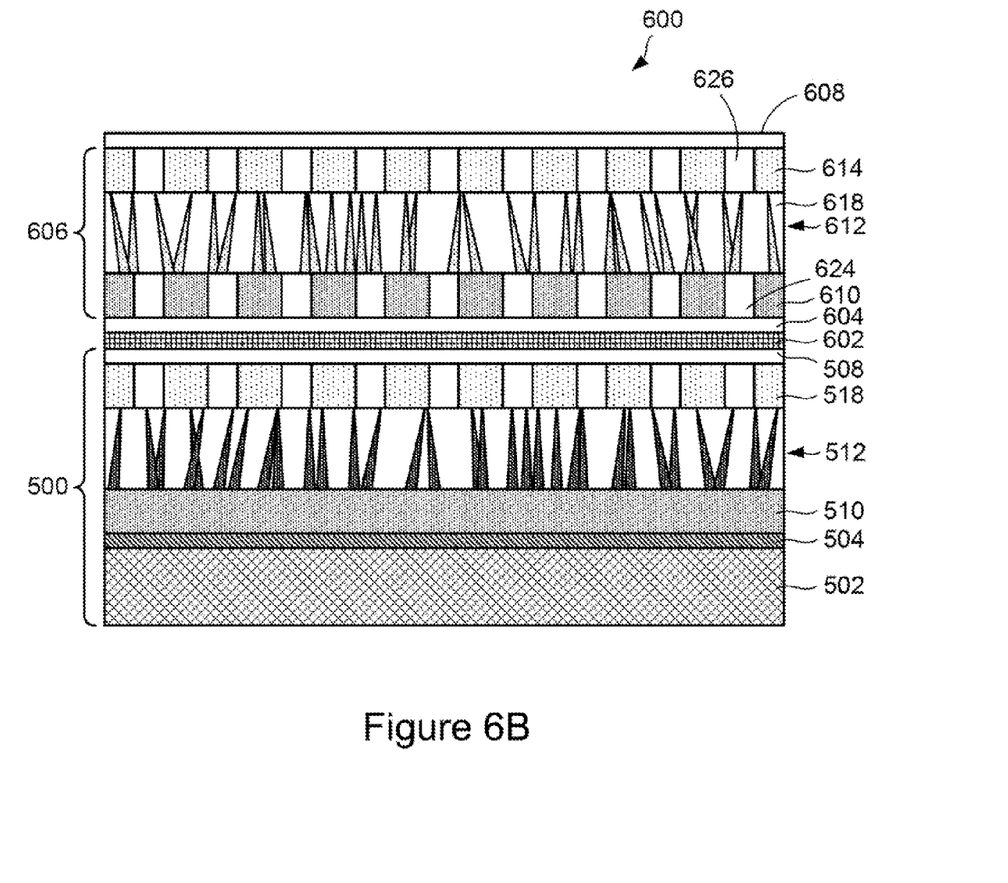
FIG. 6B shows a cross-sectional view of the third photovoltaic cell, along a line III-III shown in FIG. 6A, configured in accordance with embodiments of the present invention.

Other embodiments of the present invention include photovoltaic cells with two or more stacked light-absorption layers. FIG. 6A shows an exploded isometric view of a second photovoltaic device 600 with a stack of two vertically arranged light-absorption layers configured in accordance with embodiments of the present invention. FIG. 6B shows a cross-sectional view of the photovoltaic cell 500, along a line III-III shown in FIG. 6A, configured in accordance with embodiments of the present invention. As shown in FIG. 6, the photovoltaic device 600 includes the second photovoltaic cell 500, an insulation layer 602 disposed on the top electrode 508, a second bottom electrode 604 disposed on the insulation layer 602, a light-absorption layer 606, and a second top electrode 608 disposed on the light-absorption layer 606, The second light-absorption layer 606 is composed of an n-type semiconductor layer 610 disposed on the bottom electrode 604, a nanowire layer 612 disposed on the n-type layer 610, and a p-type semiconductor layer 614 disposed on the nanowire layer 612.

The n-type layers 610 and the p-type- layer 614 can be composed of the same elemental and compound semiconductor materials and electron donor and acceptor impurities as the n-type layer 510 and the p-type layer 518. As shown in FIG. 6A, the n-type layer 610 and the p-type layer 614 include holes, such as holes 620 and 622, As shown in FIG. 6B, the holes, such as holes 624 and 626, span the height of the layers 610 and 614, The holes facilitate transmission of light into the light absorption layers 510, 512, and 518, and the Sight absorption layers 610, 612, and 614. The nanowires in the nanowire layer 612 can be composed of an intrinsic semiconductor material embedded in glass, acrylic, or another suitable transparent dielectric material 618. The nanowires in the first nanowire layer 512 are type B nanowires, and the nanowires in the second nanowire layer 612 are type A nanowires that have a larger electronic bandgap energy that the type B nanowires. A description of how the different light-absorption layers 510 and 516 are used to convert different portions of the electromagnetic spectrum to electrical power is provided below in subsection IV. The conducting layer 602 can be composed of a suitable TCO, such as ITO, and can include a grating or have a roughened outer surface that scatters light transmitted through the second light-absorption layer 606 into the light-absorption layer 506.

Note that the photovoltaic device 600 has a p-i-n-TCO-p-i-n type structure, which forms a series connection with two terminals. In other embodiments, another suitable connection is to flip one of the photovoltaic cells upside down such that the photovoltaic device 600 has a p-i-n-TCO-n-i-p type structure, which forms a parallel connection with two terminals.

Figure 7A:
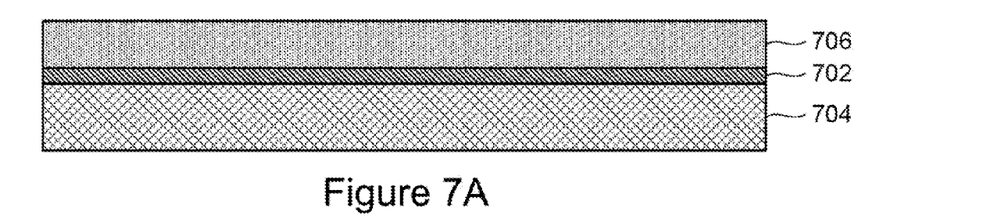
FIGS. 7A-7G show cross-sectional views of various stages of fabricating the second and third photovoltaic cells in accordance with embodiments of the present invention.
Figure 7B:
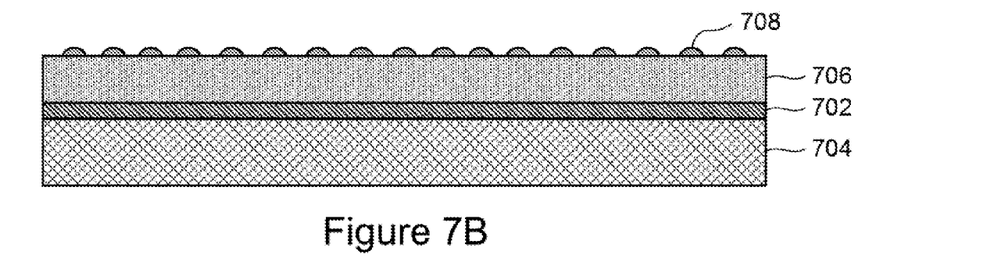
Figure 7C:
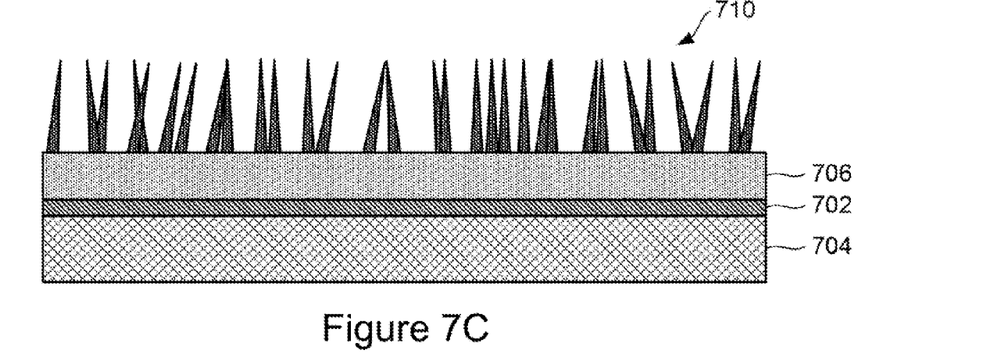
Figure 7D:
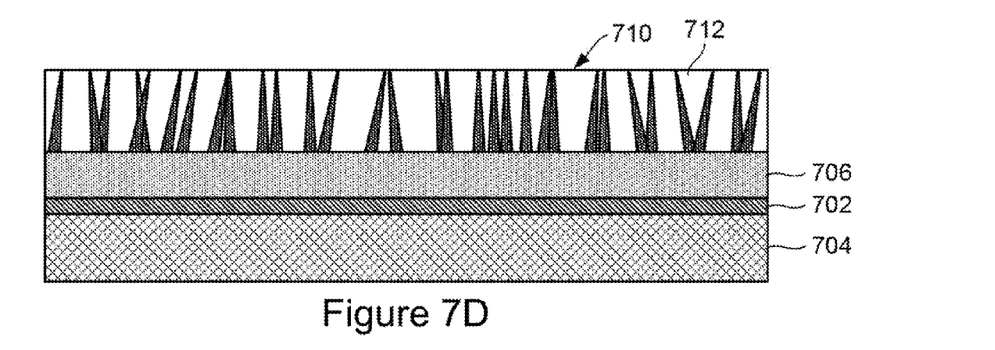
Figure 7E:
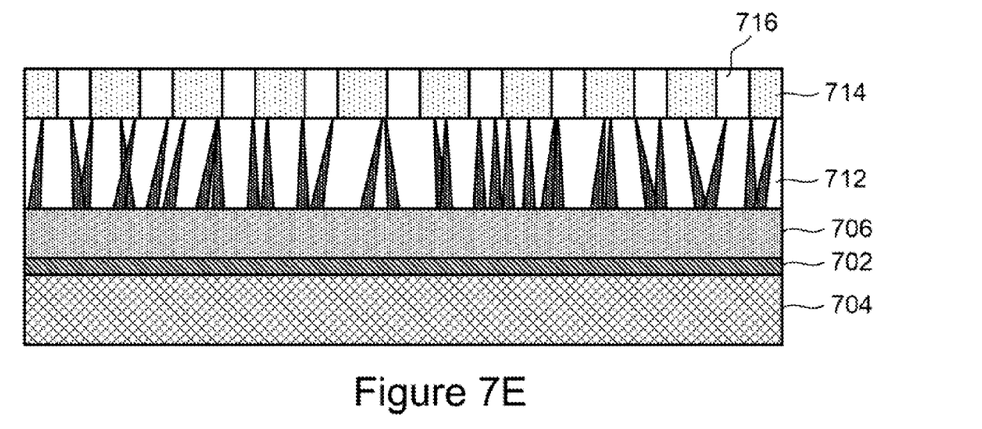
Figure 7F:
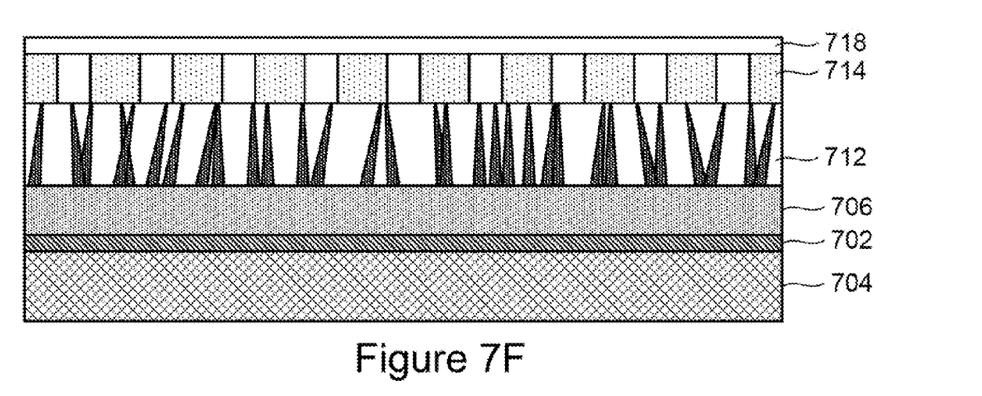
Figure 7G:
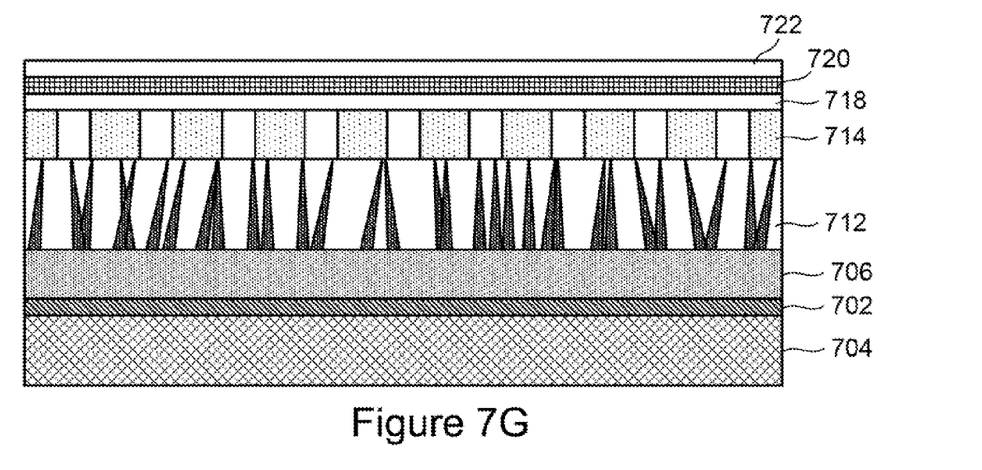

FIGS. 7A-7J show cross-sectional views of stages comprising a method for fabricating the photovoltaic cells 500 and 600 in accordance with embodiments of the present invention. Initially, as shown in FIG. 7A, a first bottom electrode 702 is deposited on a substrate 704 and a first n-type semiconductor layer 706 is deposited on bottom electrode 702. The first bottom electrode 702 can be deposited using evaporation, sputtering, atom layer deposition ("ALD"), or any other PVD technique, or wafer bonding and the first n-type layer 706 can be deposited using PECVD or wafer bonding. The layer 706 can be amorphous silicon, crystalline silicon, a compound semiconductor, or another suitable semiconductor. While the semiconductor composing the layer 706 is forming using PECVD, an appropriate electron donor impurity can be introduced to the reaction chamber. Alternatively, the layer 706 can be formed by first depositing an intrinsic semiconductor layer followed by infusing an electron donor into the layer 706 using dopant diffusion or implantation followed by annealing. Next as shown in FIG. 7B, seed particles, such as seed particle 708, are deposited on the surface of the n-type layer 702 using a spray coating process or dipped into a seed particle colloidal solution. The seed particles can be Au, Ti, Ni, Cr. Pt, Pd, Al, or another suitable metal conductor or metal alloy. Next, as shown in FIG. 7C, nanowires 710 are grown using CVD in accordance with VLS or VSS growth mechanism. Next, as shown in FIG. 7D, a transparent dielectric material 712 is deposited over the nanowires 710 using spin-on glass or dielectric deposition by ALD or CVD techniques and is subsequently planarized using CMP to expose top portions of the nanowires 710. Next, as shown in FIG. 7E, a p-type semiconductor layer 714 is deposited on the layer 712 using PECVD or water bonding. The layer 714 can be amorphous silicon, crystalline silicon, a compound semiconductor, or another suitable semiconductor. While the semiconductor composing the layer 714 is forming using PECVD, an appropriate electron acceptor impurity is introduced to the reaction chamber. Alternatively, the layer 714 can be formed by first depositing an intrinsic semiconductor followed by infusing an electron acceptor into the layer 714 using dopant diffusion or implantation followed by annealing. FIG. 7E also reveals holes, such as hole 716, in the p-type layer 714 which can be formed using RIE or FIM. Next, as shown in FIG. 7F, a top electrode 718 composed of ITO can be deposited using sputtering or wafer bonding. The final structure shown in FIG. 7G corresponds to the second photovoltaic cell 500, shown in FIG. 5.

In order to fabricate the photovoltaic device 600 shown in FIG. 6, a TCO layer 720 is deposited on the top electrode 718. The TCO layer 720 can be composed of ITO material. The surface of the TCO layer 720 can be roughened using RIE to increase scattering. After the TCO layer 720 is deposited, PECVD or wafer bonding can be used to deposit a bottom electrode 722 on the TCO layer 720. The steps described above with reference to FIGS. 7A-7F can be used to complete the fabrication of the second light-absorption layer 606 and top electrode 608 shown in FIG. 6, IV. Operation of the Stacked Nanowire-based Photovoltaic Cells The photovoltaic device 200 shown in FIG. 2 and the photovoltaic device 600 shown in FIG. 6 have in common a light-absorption layer with type A nanowires and a light-absorption layer with type B nanowires. The semiconductor material selected for the type A nanowires has a larger electronic bandgap energy than the semiconductor material selected for the type B nanowires. As a result, type B nanowires can absorb photons over a different portion of the electromagnetic spectrum of the type A nanowires.

Figure 8:
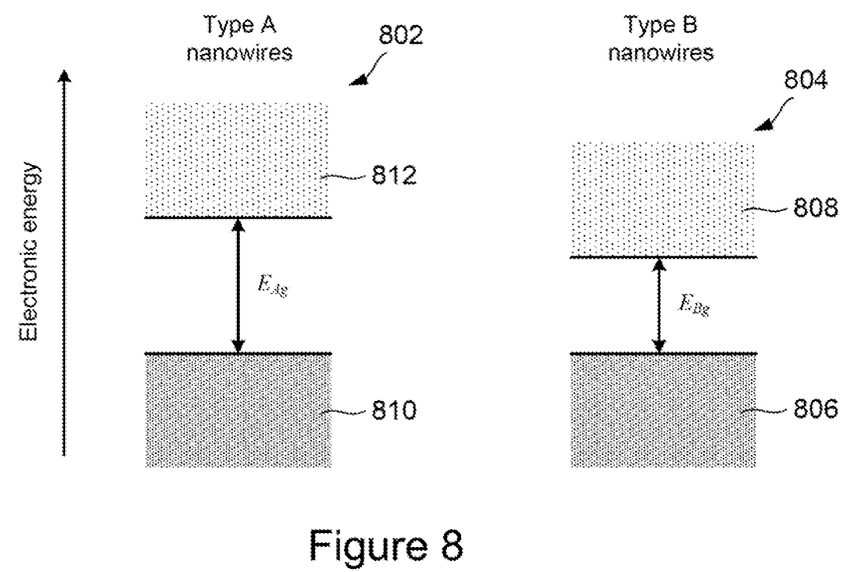
FIG. 8 shows an electronic energy-band diagram associated with two types of semiconductor nanowires.

FIG. 8 shows an electronic energy-band diagram 802 associated with the type A nanowires and an electronic energy-band diagram 804 associated with the type B nanowires. The energy-band diagrams 802 and 804 reveal a relatively larger electronic bandgap energy $E_{Ag}$ for the type A nanowires than the electronic bandgap energy $E_{Bg}$ for the type B nanowires. Light incident on the type A and type B nanowires can be composed of photons with a range of photon energies. Incident photons on the type A and type B nanowires with a photon energies E satisfying the condition;

$$E_{Bg} \leq E < E_{Ag}$$

can excite electrons from the semiconductor valence band 806 into unoccupied electronic energy states in the conduction band 808, but these photons do not have enough energy to excite electrons from valence band 810 into the unoccupied electronic energy states in the conduction band 812. In other words, the type A nanowires are transparent to photons with energies less than $E_{Ag}$. On the other hand, incident photons with photon energies E satisfying the condition;

$$E_{Bg} < E_{Ag} \leq E$$

can excite electrons from the valence band 810 into the conduction band 812 and can also excite electrons from the valence band 806 into the conduction band 808 of the type B nanowires. In other words, the type B nanowires can absorb photons with lower energies than can the type A nanowires.

Figure 9:
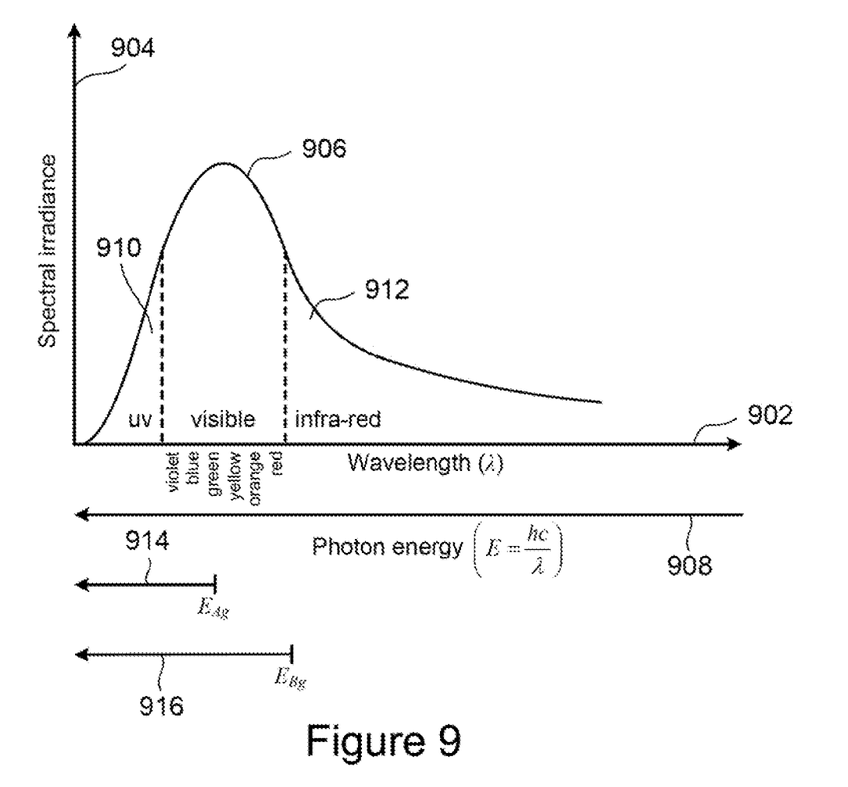
FIG. 9 shows a plot of solar spectral irradiance versus wavelength and photon energy.

The photovoltaic cells 200 and 600 can be used as solar cells to convert different portions of the spectrum of radiation emitted by the sun into electrical power. FIG. 9 shows a plot of solar spectral irradiance versus wavelength and photon energy. Horizontal axis 902 represents the wavelength of electromagnetic radiation, vertical axis 904 represents solar spectral irradiance, and curve 906 represents irradiance spectrum of sunlight that reaches the Earth's surface. Horizontal axis 908 represents photon energy E which is related to the wavelength a by $E=hc/\lambda$. For example, the ultraviolet portion 910 of the spectrum of sunlight is composed of shorter wavelength but higher energy photons than the infrared portion 912 of the spectrum. As shown in FIGS. 3 and 6, the photovoltaic cells 200 and 600 are configured and can be oriented so mat incident sunlight strikes the type A nanowires before it reaches the type B nanowires. Horizontal line 914 represents a photon energy range over which photons with photon energies greater than $E_{Ag}$ are absorbed by the type A nanowires, and horizontal line 916 represents a photon energy range over which photons with photon energies greater than $E_{Bg}$ are absorbed by the type B nanowires. Because the type A nanowires have a relatively larger electronic bandgap energy, the type A nanowires absorb over a narrower range of the spectrum of sunlight than the type B nanowires. As shown in FIGS. 3 and 6, incident sunlight reaches the type A nanowires before reaching the type B nanowires. Thus, the type A nanowires absorb high energy or short wavelengths and are transparent to photons with photon energies less than $E_{Ag}$. A portion of the high energy photons not absorbed by the type A nanowires can still be absorbed by the type B nanowires. For example, as shown in FIG. 9, the type A nanowires can absorb photons with wavelengths ranging from the green to the ultraviolet portion of the spectrum 906. The type B nanowires can also absorb photons within the ultraviolet to green portions of the spectrum that are not absorbed by the type A nanowires. In addition, the type B nanowires can absorb photons ranging from the yellow portion to the red portion of the spectrum.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated, it is Intended that the scope of the invention be defined by the following claims and their equivalents;

The invention claimed is:

1. A photovoltaic cell comprising:
a first electrode disposed on a substrate;
a light-absorption layer disposed on the electrode, wherein the light-absorption layer includes a nanowire-based intermediate layer, the nanowire-based intermediate layer comprising a plurality of nanowires sandwiched between an n-type semiconductor layer and a p-type semiconductor layer such that a number of the nanowires in the intermediate layer are in contact with the p-type layer at one end and in contact with the n-type layer at the other end, wherein one semiconductor layer is an upper layer and the other semiconductor layer is a lower layer; and
a second electrode disposed on the light absorption layer, wherein the upper layer includes holes terminating at the nanowire-based intermediate layer to facilitate incident light reaching the nanowire-based intermediate layer.

2. The photovoltaic cell of claim 1 wherein the first electrode further comprises stainless steel, aluminum, copper, or another metal conductor.

3. The photovoltaic cell of claim 1 wherein the second electrode further comprises one of:
tin-doped indium oxide or another transparent conducting material; and
a metal conductor disposed on at least a portion of the light-absorption layer.

4. The photovoltaic cell of claim 1 wherein the nanowire-based intermediate layer further comprises the nanowires embedded in a transparent dielectric material.

5. The photovoltaic cell of claim 1 further comprising:
   an insulation layer disposed on the second electrode;
   a third electrode disposed on the insulation layer;
   a second light-absorption layer disposed on the third electrode; and
   a fourth electrode disposed on the second light-absorption layer.

6. The photovoltaic cell of claim 5 wherein the insulation layer further comprises a transparent dielectric material having a grating or a roughened outer surface.

7. The photovoltaic cell of claim 5 wherein the third and fourth electrode further comprise tin-doped indium oxide.

8. The photovoltaic cell of claim 5 wherein the second light-absorption layer further comprises a second nanowire-based intermediate layer sandwiched between a second n-type semiconductor layer and a second p-type semiconductor layer such that a number of the nanowires in the second intermediate layer are in contact with the second p-type layer at one end and in contact with the second n-type layer at the other end.

9. The photovoltaic cell of claim 1 wherein the n-type layer and the p-type layer are both substantially transparent to incident light.

10. The photovoltaic cell of claim 1 wherein the nanowires comprise an intrinsic semiconductor material.

* * * * *